(12) United States Patent
Choi

(10) Patent No.: US 8,399,391 B2
(45) Date of Patent: Mar. 19, 2013

(54) PHOTORESIST RESIDUE REMOVAL COMPOSITION

(76) Inventor: Ho Sung Choi, Gyeonggi-do (KR)

( * ) Notice: Subject to any disclaimer, the term of this patent is extended or adjusted under 35 U.S.C. 154(b) by 428 days.

(21) Appl. No.: 12/607,269

(22) Filed: Oct. 28, 2009

(65) Prior Publication Data

US 2010/0173251 A1    Jul. 8, 2010

(30) Foreign Application Priority Data

Jan. 8, 2009   (KR) ................. 10-2009-0001437

(51) Int. Cl.
*C11D 7/26* (2006.01)
*C11D 7/32* (2006.01)
(52) U.S. Cl. .................... 510/176; 510/175
(58) Field of Classification Search .............. 430/256, 430/331; 510/175, 176
See application file for complete search history.

(56) References Cited

U.S. PATENT DOCUMENTS

| 3,577,920 A | * | 5/1971 | London et al. | 101/459 |
| 3,639,278 A | * | 2/1972 | Hwa | 510/253 |
| 3,870,787 A | * | 3/1975 | Blumenthal | 423/598 |
| 3,886,099 A | * | 5/1975 | Hall | 510/175 |
| 5,354,808 A | * | 10/1994 | Onwumere et al. | 524/837 |
| 6,869,921 B2 | * | 3/2005 | Koito et al. | 510/176 |
| 7,858,572 B2 | * | 12/2010 | Choi et al. | 510/175 |
| 2003/0138737 A1 | * | 7/2003 | Wakiya et al. | 430/331 |
| 2004/0234904 A1 | * | 11/2004 | Rieker et al. | 430/329 |
| 2007/0251154 A1 | * | 11/2007 | Lombardi | 51/298 |
| 2008/0110477 A1 |   | 5/2008 | Jung et al. | |

FOREIGN PATENT DOCUMENTS

| KR | 1020040040513 A |   | 5/2004 |
| KR | 10-2008-0076016 | * | 8/2008 |
| KR | 1020080076016 A |   | 8/2008 |
| KR | 10-2009-0045987 | * | 5/2009 |
| WO | 97/42297 A1 |   | 11/1997 |
| WO | WO 2007/074990 | * | 7/2007 |

OTHER PUBLICATIONS

Machine translation of KR 10-2008-0076016, published on Aug. 20, 2008.*
Machine translation of KR-10-2009-0045987, published on May 11, 2009.*
Extended European Search Report; dated Dec. 17, 2012; Appln. No. 10150217.7-1235/2207197.

* cited by examiner

*Primary Examiner* — Anca Eoff
(74) *Attorney, Agent, or Firm* — Ladas & Parry LLP

(57) ABSTRACT

A photoresist residue removal composition is provided. The photoresist residue removal composition essentially contains glycolic and water, to which a pH control agent and/or a cleanability improver is selectively added. The photoresist residue removal composition has a high capability to remove residues caused by plasma etching and ashing of a metal or silicon oxide layer under a photoresist pattern, does not cause corrosion, and is eco-friendly.

12 Claims, 2 Drawing Sheets

Before Processing

After Processing

Comparative Example

Example

Before Processing

After Processing

PHOTORESIST RESIDUE REMOVAL COMPOSITION

CROSS-REFERENCE TO RELATED APPLICATION

This application claims priority to and the benefit of Korean Patent Application No. 10-2009-0001437, filed Jan. 8, 2009, the disclosure of which is incorporated herein by reference in its entirety.

BACKGROUND

1. Field of the Invention

The present invention relates to a photoresist residue removal composition, capable of removing residues caused by plasma etching and ashing of a metal or silicon oxide layer under a photoresist pattern in a semiconductor fabrication process. More specifically, the present invention relates to a photoresist residue removal composition, which essentially contains glycolic acid, and thus has a high capability to remove photoresist residues without causing corrosion and is eco-friendly.

2. Discussion of Related Art

In a series of semiconductor fabrication processes such as photolithography, dry etching or wet etching for forming metal interconnections or contact points, plasma ashing, etc., organic or metallic residues are generated. Thus, it is essential to first remove these undesired residues in order to carry out the subsequent processes.

Up to now, these residues have been removed under high temperatures between 60° C. and 85° C. using a composition containing hydroxylamine, alcohol amines, water, and a corrosion inhibitor. However, the composition including these amines generates hydroxyl ions in a water cleaning process, so that isopropyl alcohol (IPA) is used as an intermediate rinse in order to prevent corrosion.

Typical products used up to now include ACT-935 available from ACT Chemical Technology Co., Ltd. and EKC-265 available from E. I. du Pont de Nemours and Company. However, these compositions are generally limited in their applicability due to galvanic corrosion and toxicity.

With development of cleaning equipment and miniaturization of a semiconductor line width, new compositions using fluorine have currently been released in the market. These compositions add a polar solvent and a corrosion inhibitor to dilute hydrofluoric acid (DHF) or buffered oxide etchant (BOE) (i.e. a mixture of hydrofluoric acid (HF) with ammonium fluoride ($NH_4F$)) used in an existing semiconductor fabrication process, and are used at room temperature (ranging from 20° C. to 30° C.). These compositions have an advantage in that no intermediate rinse is required, but a disadvantage in that control over the oxide attack of a pattern is required.

The photoresist residue removal compositions used up to now frequently cause damage to metal interconnections due to corrosive or galvanic reaction of a lower layer, and thus have a tremendous influence on an electric resistance value. Further, the photoresist residue removal compositions reduce a semiconductor device yield due to the influence of particles attached again to the surface of a wafer.

Further, the oxidant that is in use now, hydroxylamine, has very strong toxicity, and is always exposed to a possibility of product supply disruption due to the danger of explosion when formed.

SUMMARY OF THE INVENTION

The present invention is directed to a photoresist residue removal composition, capable of solving a problem in which, since the thickness of an aluminum interconnection is increased despite the gradual miniaturization of a semiconductor pattern, and thus a time required for plasma etching is prolonged to considerably increase a quantity of electric charges accumulated on an aluminum pattern, a hydroxylamine polymer remover used up to now generates galvanic corrosion from an aluminum/copper alloy, and thus greatly varies an electric resistance value of the aluminum interconnection, and of meeting eco-friendly requirements prevailing all over the world.

An aspect of the present invention provides a photoresist residue removal composition containing 1 wt % to 70 wt % glycolic acid, and the remainder water.

The photoresist residue removal composition may further include a pH control agent, which adjusts the pH of the composition to a range from 4 to 10. The pH control agent may be further added within a range from 5 to 50 parts by weight based on 100 parts by weight of a mixture of glycolic acid and water.

Here, the pH control agent may include one or a combination of two or more of amines selected from the group consisting of primary, secondary and tertiary alkylamines, and alkanolamines, where alkyl and alkanol each are linear, branched or cyclic hydrocarbon having 2 to 10 carbon atoms.

Further, the photoresist residue removal composition may further include a cleanability improver, which includes at least one selected from the group consisting of primary alcohol, secondary alcohol, tertiary alcohol, and glycol represented by the following formula. The alcohol may include linear, branched or cyclic hydrocarbon alcohol, each of which has 2 to 10 carbon atoms.

Further, the cleanability improver may be further contained within a range from 10 to 70 parts by weight based on 100 parts by weight of a mixture of glycolic acid and water.

Also, the pH control agent may include one selected from monoethanolamine, isopropanolamine, 2-(2 aminoethoxy) ethanol, and tetrahydrofurfurylamine. The cleanability improver may include one selected from diethyleneglycolmonoethylether, diethyleneglycolmonomethylether, diethyleneqlycolmonobutylether, triethyleneglycolether, and tetrahydrofurfurylalcohol.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EMBODIMENTS

Figure 1:
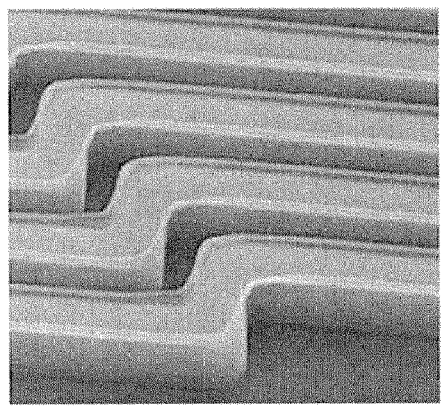
FIG. 1 shows SEM photographs of the surface of a wafer processed with a composition of Example 1 of the present invention.
Figure 1:
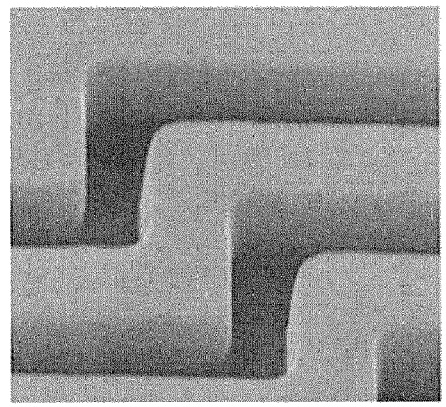

The present invention will now be described more fully hereinafter with reference to the accompanying drawings, in which exemplary embodiments of the invention are shown.

An aspect of the present invention provides a photoresist residue removal composition that contains 1 to 70 wt % glycolic acid and the remainder water.

The present invention employs glycolic acid, which has remarkable residue removability and is eco-friendly, in place of an important oxidant, hydroxylamine, of a polymer remover used up to now. Generally, the glycolic acid is used as a primary ingredient of a chemical peel in cosmetics. Since the glycolic acid causes relatively less metal corrosion and can selectively remove organic matters only, the glycolic acid effectively selectively dissolves an insoluble metallic residue without corrosion of metal interconnections. Thus, the glycolic acid relieves galvanic corrosion occurring during a subsequent deionized water cleaning process.

The glycolic acid may be used within a range from 1 to 70 wt %. If the glycolic acid is less than 1 wt %, the glycolic acid does not smoothly act as the oxidant. On the other hand, if the glycolic acid is more than 70 wt %, an excessive pH control agent must be used to adjust the pH of the composition to a range from 4 to 10 due to the acidity of the glycolic acid. This has an influence on percentage composition of other ingredients, and thus is not desirable. More preferably, the glycolic acid has a content ranging from 40 to 70 wt %.

An amount of water has a great influence on the oxidizing power of glycolic acid. The more water that is contained, the stronger the polymer removability becomes, however the corrosion of the metal interconnections also becomes stronger. By contrast, when the amount of water is small, the polymer removability becomes weak, but the corrosion of the metal interconnections is reduced. As such, a proper amount of water is required, and is used within a range from 30 to 99 wt % and more preferably from 30 to 60 wt %.

Another aspect of the present invention provides a photoresist residue removal composition that contains a pH control agent of 5 to 50 parts by weight, which adjusts the pH of the composition to a range from 4 to 10, based on 100 parts by weight of a mixture of glycolic acid and water.

The pH control agent is mixed with the glycolic acid, and adjusts the pH of the composition to a range from 4 to 10. The pH of the composition is adjusted for the following reasons. In the case of strong acidity, there is a high possibility of causing arching when a metal wafer on which many charges are accumulated is processed. By contrast, in the case of strong basicity, there is a high possibility of causing the corrosion of the metal interconnections and the galvanic corrosion.

A material available for adjusting the pH includes amines or alkanolamines, which may be used either individually or in combination of two or more. The amines may include all commercialized primary, secondary and tertiary alkylamines, as well as all commercialized alkanolamines.

This is because both amines and alkanolamines simply serve to adjust the pH through mixture with the glycolic acid, and additionally function to dissolve the organics.

In the alkylamines, alkyl indicates linear, branched or cyclic hydrocarbon, each of which has 2 to 10 carbon atoms. In the alkanolamines, alkanol indicates linear, branched or cyclic hydrocarbon alcohol, each of which has 2 to 10 carbon atoms.

The pH control agent varies depending on the amount of the glycolic acid and the pH to be adjusted, but is properly included within a range from 5 to 50 parts by weight.

Here, when the amount of the pH control agent is too much or little, the pH may become too high or low, and the corrosion of the metal interconnections may occur.

The present invention may additionally use a cleanability improver in order to improve cleaning power to minimize generation of particles. Here, the cleanability improver may include one or a combination of two or more of alcohol and glycols. The available alcohol and glycols may include any commercialized material. Usually, a material having a boiling point of 150° C. or more helps keep the life span of a bath.

Thus, another aspect of the present invention provides a photoresist residue removal composition that contains a pH control agent of 5 to 50 parts by weight, which adjusts the pH of the composition to a range from 4 to 10, and a cleanability improver of 10 to 70 parts by weight, which includes at least one selected from the group consisting of primary alcohol, secondary alcohol, tertiary alcohol, and glycol represented by the following formula, based on 100 parts by weight of a mixture of glycolic acid and water. Here, the alcohol includes linear, branched or cyclic hydrocarbon alcohol, each of which has 2 to 10 carbon atoms.

An added amount of the cleanability improver may range from 10 to 70 parts by weight. When the added amount of the cleanability improver is too small, the improvement of cleanability has little effect. On the other hand, when the added amount of the cleanability improver is too much, a mixing ratio with other ingredients should be taken into consideration.

Hereinafter, Examples of the present invention will be described in greater detail.

Examples 1 through 4

Photoresist residue removal compositions containing glycolic acid and water were prepared with compositions shown in Table 1 below, and their effectiveness was verified.

Example 5

A photoresist residue removal composition containing glycolic acid, tetrahydrofurfurylamine (THFN) as a pH control agent, and water was prepared with a composition shown in Table 1 below, and its effectiveness was verified.

Examples 6 through 14

Photoresist residue removal compositions containing glycolic acid, a pH control agent, a cleanability improver, and water were prepared with compositions shown in Table 1 below, and their effectiveness was verified.

TABLE 1

| Example | Composition (parts by weight) | | | |
|---|---|---|---|---|
| 1 | GA: 70 | Water: 30 | | |
| 2 | GA: 60 | Water: 40 | | |
| 3 | GA: 50 | Water: 50 | | |
| 4 | GA: 40 | Water: 60 | | |
| 5 | GA: 53 | Water: 47 | THFN: 35 | |
| 6 | GA: 40 | Water: 60 | THFN: 15 | EDG: 35 |
| 7 | GA: 25 | Water: 75 | THFN: 8 | EDG: 52 |
| 8 | GA: 25 | Water: 75 | MEA: 8 | EDG: 52 |
| 9 | GA: 25 | Water: 75 | MIPA: 8 | EDG: 52 |
| 10 | GA: 25 | Water: 75 | AEE: 8 | EDG: 52 |
| 11 | GA: 25 | Water: 75 | THFN: 8 | MDG: 52 |
| 12 | GA: 25 | Water: 75 | THFN: 8 | EDG: 52 |
| 13 | GA: 25 | Water: 75 | THFN: 8 | TEG: 52 |
| 14 | GA: 25 | Water: 75 | THFN: 8 | THFA: 52 |

THFA: tetrahydrofurfurylalcohol
THFN: tetrahydrofurfurylamine
MEA: monoethanolamine
MIPA: isopropanolamine
AEE: 2-(2 aminoethoxy)ethanol
GA: glycolic acid
EDG: diethyleneglycolmonoethylether
MDG: diethyleneglycolmonomethylether
BDG: diethyleneglycolmonobuthylether
TEG: triethyleneglycolether

Experimental Example 1

A borophosphosilicate glass (BPSG)/TiN/Al—Cu/TiN wafer was processed at 70° C. for 10 minutes using the composition of Example 1, and was cleaned for 15 minutes using deionized water. A surface of the wafer was photographed with a scanning electron microscope (SEM) before and after being processed. The results are shown in FIG. 1.

As shown in FIG. 1, it can be seen that polymer can be removed by the composition of glycolic acid and water, and that there is no corrosion of the metal interconnections.

Experimental Example 2

A BPSG/TiN/Al—Cu/TiN wafer was processed at 70° C. for 10 minutes using the composition of Example 14 and a comparative composition (containing 17.6 wt % hydroxylamine, 17.6 wt % water, 5.0 wt % catechol, and 59.8 wt % ethanolamine), and was cleaned for 30 minutes using deionized water. A surface of the wafer was photographed with a SEM before and after being processed. The results are compared and shown in FIG. 2.

Figure 2:
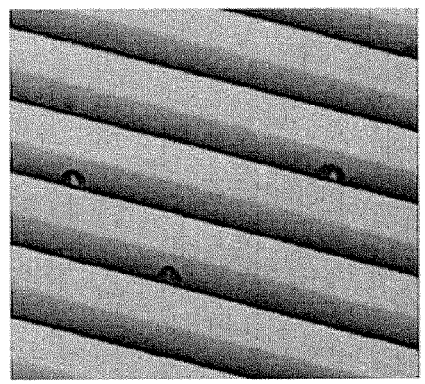
FIG. 2 shows SEM photographs of the surfaces of wafers, which are processed with a composition of Example 14 of the present invention and a hydroxylamine composition and then compared with each other.
Figure 2:
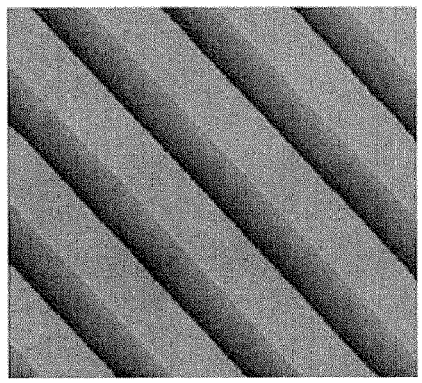

As shown in FIG. 2, it can be seen that the inventive composition containing the glycolic acid is remarkably reduced in galvanic corrosion compared to the comparative composition containing the hydroxylamine.

Experimental Example 3

A BPSG/TiN/Al—Cu/TiN wafer was processed at 70° C. for 10 minutes using the composition of Example 5, and was cleaned for 15 minutes using deionized water. A surface of the wafer was photographed with a SEM before and after being processed. The results are shown in FIG. 3.

Figure 3:
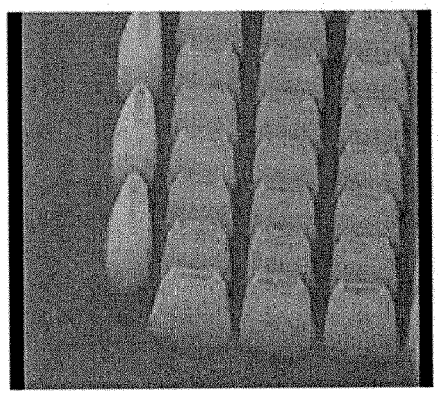
FIG. 3 shows SEM photographs of the surface of a wafer processed with a composition of Example 5 of the present invention.
Figure 3:
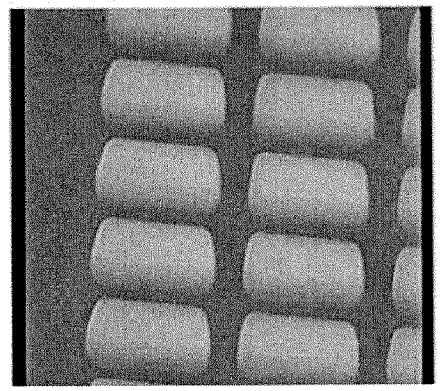

As shown in FIG. 3, it can be seen that polymer can be removed by the composition of glycolic acid, THFN, and water, and that there is no corrosion of the metal interconnections.

According to the present invention, a photoresist residue removal composition is excellent in removing insoluble residues occurring after etching and ashing processes in a semiconductor fabrication process, and has strong resistance to galvanic corrosion unlike hydroxylamines used up to now, so that it can clean aluminum and copper interconnections as well as tungsten plugs.

Further, the photoresist residue removal composition is composed of unharmful ingredients, and thus is more eco-friendly than an existing polymer remover, so that it can contribute to improving a semiconductor fabrication environment.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A photoresist residue removal composition comprising:
   glycolic acid between 25 wt % to 70 wt %;
   tetrahydrofurfurylalcohol;
   a pH control agent comprising tetrahydrofurfurylamine; and
   water.

2. The photoresist residue removal composition of claim 1, wherein the pH control agent is within a range from 5 to 50 parts by weight based on 100 parts by weight of the glycolic acid and water.

3. The photoresist residue removal composition of claim 1, wherein the composition has a pH between 4 to 10 which is adjusted by the pH control agent.

4. The photoresist residue removal composition of claim 1, wherein the pH control agent further comprises 2-(2 aminoethoxy)ethanol.

5. The photoresist residue removal composition of claim 1, wherein the pH control agent further comprises isopropanolamine.

6. The photoresist residue removal composition of claim 1, wherein the pH control agent further includes monoethanolamine.

7. The photoresist residue removal composition of claim 1, wherein
   the glycolic acid is between 25 wt % to 70 wt %;
   the tetrahydrofurfurylalcohol is between 10 wt % to 70 wt %; and
   the water is between 30 wt % to 99 wt %.

8. The photoresist residue removal composition of claim 1, wherein
   the glycolic acid is between 25 wt % to 70 wt %;
   the tetrahydrofurfurylalcohol is between 10 wt % to 70 wt %;
   the water is between 30 wt % to 99 wt %; and
   the pH control agent is between 5 wt % to 50 wt %.

9. A photoresist residue removal composition comprising:
   glycolic acid between 40 wt % to 70 wt %;
   tetrahydrofurfurylalcohol;
   water; and
   a pH control agent comprising tetrahydrofurfurylamine.

10. The photoresist residue removal composition of claim 9, wherein the pH control agent further comprises compounds selected from the group consisting of monoethanolamine, isopropanolamine, and 2-(2 aminoethoxy)ethanol.

11. The photoresist residue removal composition of claim 9, wherein the photoresist residue removal composition has a pH between 4 and 10.

12. The photoresist residue removal composition of claim 9, wherein
   the glycolic acid is between 40 wt % to 70 wt %;
   the tetrahydrofurfurylalcohol is between 10 wt % to 70 wt %;
   the water is between 30 wt % to 99 wt %; and
   the pH control agent is between 5 wt % to 50 wt %.

* * * * *